(12) United States Patent
Xu

(10) Patent No.: US 11,233,072 B2
(45) Date of Patent: Jan. 25, 2022

(54) ARRAY SUBSTRATE, DISPLAY PANEL AND MANUFACTURING METHOD OF ARRAY SUBSTRATE

(71) Applicant: TCL CHINA STAR OPTOELECTRONICS TECHNOLOGY CO., LTD., Shenzhen (CN)

(72) Inventor: Peipei Xu, Shenzhen (CN)

( * ) Notice: Subject to any disclaimer, the term of this patent is extended or adjusted under 35 U.S.C. 154(b) by 197 days.

(21) Appl. No.: 16/627,816

(22) PCT Filed: Dec. 27, 2019

(86) PCT No.: PCT/CN2019/129249
§ 371 (c)(1),
(2) Date: Dec. 31, 2019

(87) PCT Pub. No.: WO2021/120311
PCT Pub. Date: Jun. 24, 2021

(65) Prior Publication Data
US 2021/0358962 A1    Nov. 18, 2021

(30) Foreign Application Priority Data
Dec. 17, 2019 (CN) .......................... 201911299096.5

(51) Int. Cl.
*H01L 27/12* (2006.01)
(52) U.S. Cl.
CPC .......... *H01L 27/124* (2013.01); *H01L 27/127* (2013.01); *H01L 27/1237* (2013.01)
(58) Field of Classification Search
CPC ......... H01L 29/78645; H01L 29/78663; H01L 29/6675; H01L 51/5237; H01L 51/56; H01L 27/3276; H01L 2251/305
See application file for complete search history.

(56) References Cited

U.S. PATENT DOCUMENTS

2015/0108481 A1* 4/2015 Khang .............. H01L 29/78696
257/59
2020/0287052 A1* 9/2020 Qu .................... H01L 29/78663

* cited by examiner

*Primary Examiner* — Dung A. Le

(57) ABSTRACT

An array substrate, a display panel and a method for manufacturing the array substrate are provided. The array substrate further includes a first via and a second via. A conductive layer fills the first via and the second via to electrically connect the first metal layer and the second metal layer. The first via is disposed on a side of the second via, and a passivation layer partially extends between the first via and the second via. The display panel includes the above-mentioned array substrate.

9 Claims, 4 Drawing Sheets

ARRAY SUBSTRATE, DISPLAY PANEL AND MANUFACTURING METHOD OF ARRAY SUBSTRATE

FIELD OF INVENTION

The present invention relates to the field of display technologies, and in particular, to an array substrate, a display panel, and a method for manufacturing the array substrate.

BACKGROUND OF INVENTION

As shown in FIG. 1, an array substrate 90 at a peripheral wiring of a current liquid crystal display panel includes a first metal layer 91, a gate insulating layer 92, a second metal layer 93, a passivation layer 94, and a conductive layer 95 that are stacked. In order to realize the first metal layer 91 and the second metal layer 93 to conduct electrical signals, it is generally necessary to provide a first via 96 and a second via 97 to conduct the conductive layer 95 to the first metal layer 91 and the second metal layer 93.

There are currently two ways to set vias, one is a dual-hole design (that is, the first via 96 and the second via 97 are separated), and the other is a single deep-shallow hole design (that is, the first via 96 adjacent to the second via 97, it looks like a via).

As shown in FIG. 2, it is a top view of a dual-hole design, and in combination with FIG. 1, it can be seen that the first via 96 is specifically provided on the first metal layer 91, and the first via 96 penetrates the passivation layer 94 and the gate insulating layer 92. The second via 97 is provided on the second metal layer 93, and the second via 97 penetrates the passivation layer 94. Then, a conductive layer 95 is provided to connect the first metal layer 91 and the second metal layer 93 through the first via 96 and the second via 97, but in this way, two holes need to be provided, so an occupied area is large and a pixel aperture ratio will be reduced.

As shown in FIG. 3, it is a top view of the single deep-shallow hole design, in conjunction with FIG. 1, it can be simply understood as a distance between the first via 96 and the second via 97 is reduced, so that the passivation layer 94 between the first via 96 and the second via 97 disappears. Therefore, the manufactured first via 96 and the second via 97 connect to each other as one via. Since a depth of the first via 96 is greater than a depth of the second via 97, it is called a single deep-shallow hole. Many processing problems and display problems will occur in the deeper first via 96, such as the poor lapping connection problem of the undercut of the gate insulating layer 92, the bird's beak, and the conductive layer 95 being broken, etc. caused by a side of the gate insulating layer 92 being etched, which causes a contact resistance between the first metal layer 91 and the second metal layer 93 to increase.

For another example, in a three thin film transistor (TFT)-charge-sharing eight-domain viewing angle improvement technology, where the three TFTs includes a main TFT, a secondary TFT, and a shared TFT, in order to ensure a sufficient aperture ratio, it is necessary to use a single deep-shallow hole structure to increase the aperture ratio, and in the case of a limited size of the deep-shallow hole, the poor lapping connection of the conductive layer will cause current leakage, poor conductivity, and charge accumulation of the shared TFT, which will cause a series of display problems and increase manufacturing costs.

Therefore, it is necessary to design a new array substrate, a display panel, and a manufacturing method of the array substrate to solve the problems in the conventional art.

SUMMARY OF INVENTION

Technical Problem

In view of the shortcomings and deficiencies in the conventional art, the present invention provides an array substrate, a display panel, and an array substrate manufacturing method. By improving a single deep-shallow hole technology, the problem of poor lapping connection of a conductive layer at a deep-shallow hole can be solved, which can further reduce a contact resistance between a first metal layer and a second metal layer in the deep-shallow hole, improving product yield, and reducing production costs.

Technical Solutions

The objective of the present invention is achieved by the following technical solutions.

An object of the present invention is to provide an array substrate including a first metal layer, a gate insulating layer, a second metal layer, a passivation layer, and a conductive layer which are disposed in a stack, and the conductive layer conducts the first metal layer and the second metal layer. Specifically, the gate insulating layer is disposed on the first metal layer, the second metal layer is disposed on the gate insulating layer, the passivation layer is disposed on the second metal layer, and the conductive layer is disposed on the passivation layer.

The array substrate further includes a first via and a second via. Specifically, the first via penetrates the passivation layer and the gate insulation layer, and exposes the first metal layer. The second via penetrates the passivation layer and exposes the second metal layer, wherein the conductive layer fills the first via and the second via to electrically connect the first metal layer and the second metal layer, the first via is disposed on a side of the second via, and the passivation layer partially extends between the first via and the second via.

Furthermore, a distance between the first via and the second via is less than two times a photoresist layer etching fade distance, and the photoresist layer etching fade distance is an etching fade distance of a photoresist layer provided to protect the passivation layer when the first via and the second via are made.

Furthermore, material of the first metal layer or the second metal layer includes one or a stacked combination of copper, aluminum, and molybdenum.

Furthermore, the gate insulating layer or the passivation layer is made of silicon oxide, silicon nitride, or a combination of silicon oxide and silicon nitride.

Furthermore, material of the conductive layer includes indium tin oxide.

Another object of the present invention is to provide a display panel including the array substrate according to any one of the above.

Another object of the present invention is to provide a method for manufacturing an array substrate, including the following steps:

forming a first metal layer, wherein a glass substrate is provided, and a first metal layer is formed on the glass substrate;

forming a gate insulating layer, wherein the gate insulating layer is formed on the first metal layer;

forming a second metal layer, wherein the second metal layer is formed and patterned on the gate insulating layer;

forming a passivation layer, wherein the passivation layer is formed on the gate insulating layer, the passivation layer covers the second metal layer, and the passivation layer partially extends on the first metal layer;

forming a photoresist layer, wherein the photoresist layer is formed on the passivation layer, the photoresist layer includes a first etching hole and a second etching hole, and the second etching hole is disposed opposite to the second metal layer and the first etching hole is disposed on a side of the second etching hole;

an etching and digging hole step, etching on a side of the photoresist layer, and forming a first via corresponding to the first etching hole and a second via corresponding to the second etching hole after etching; wherein the first via penetrates the passivation layer and the gate insulation layer and exposes the first metal layer, the second via penetrates the passivation layer and exposes the second metal layer, and the passivation layer partially extends between the first via and the second via;

a photoresist layer removing step, removing the remaining photoresist layer; and forming a conductive layer, wherein the conductive layer is formed on a side of the passivation layer, the conductive layer is disposed in the first via and the second via and conducts the first metal layer and the second metal layer.

Furthermore, a method of removing the remaining photoresist layer is to dry and bake the photoresist layer to make the photoresist layer fall off.

Furthermore, the step of forming the photoresist layer includes:

setting a photomask, disposing the photomask above the photoresist layer, wherein the photomask includes a first through hole and a second through hole; and photolithographing, wherein the photoresist layer forms a first etching hole corresponding to the first through hole and a second etching hole corresponding to the second through hole after photolithographing.

Furthermore, the photomask includes a half tone mask.

Beneficial Effect

The beneficial effect of the present invention is to provide an array substrate, a display panel, and a method for manufacturing the array substrate. By improving the via structure of the single deep-shallow hole to adjust the distance between the first via and the second via to realize that the passivation layer between the first via and the second via is retained in the manufacturing process, which can avoid poor lapping connection problems easily encountered in the deeper first via such as the undercut of the gate insulating layer, the bird's beak, and the conductive layer being broken, etc. caused by a side of the gate insulating layer being etched. It can solve the poor lapping connection problem of the conductive layer in the deep-shallow hole (that is, the combination of the first via and the second via), and further reduce the contact resistance between the first metal layer and the second metal layer in the single deep-shallow hole, improving product yield, and reducing production costs.

BRIEF DESCRIPTION OF FIGURES

The following detailed description of specific embodiments of the present application will make the technical solutions and other beneficial effects of the present application obvious in conjunction with the accompanying drawings.

The components in the figures are identified as follows.

Figure 1:
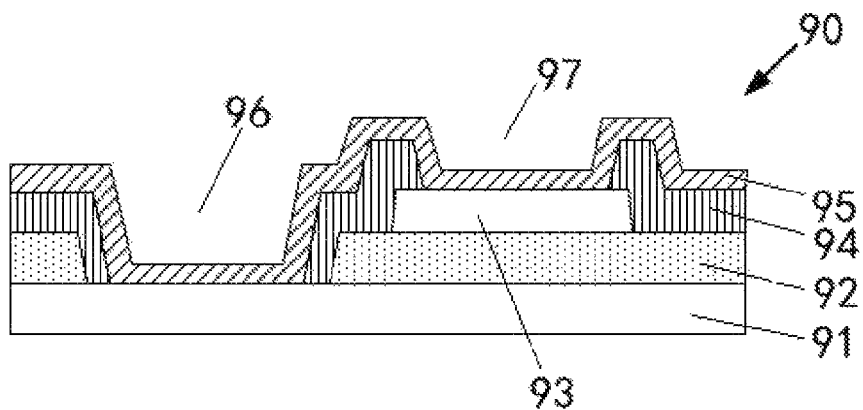
FIG. 1 is a schematic structural diagram of a conventional array substrate.
Figure 2:
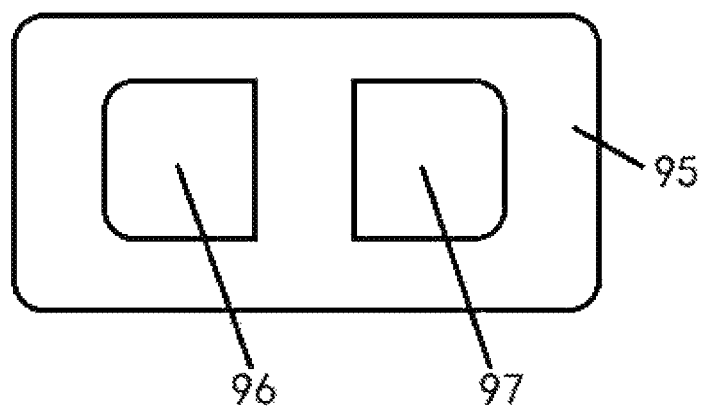
FIG. 2 is a top view of a conventional dual-hole design.
Figure 3:
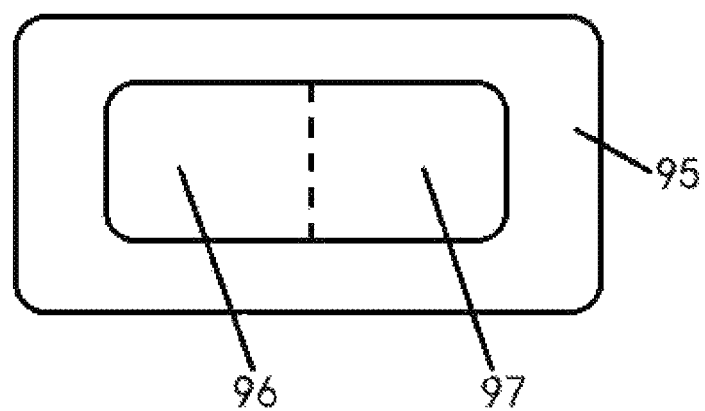
FIG. 3 is a top view of a conventional single deep-shallow hole design.

1, first metal layer; 2, gate insulating layer; 3, second metal layer; 4, passivation layer;

5, conductive layer; 6, photoresist layer; 61, first etching hole; 62, second etching hole;

10, array substrate; 11, first via; 12, second via;

20, photomask; 21, first through hole; and 22, second through hole.

DETAILED DESCRIPTION OF EMBODIMENTS

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

In the description of this application, it should be noted that the terms "installation", "connected", and "coupled" should be understood in a broad sense, unless explicitly stated and limited otherwise. For example, they may be fixed connections, removable connected or integrally connected; it can be mechanical, electrical, or can communicate with each other; it can be directly connected, or it can be indirectly connected through an intermediate medium, it can be an internal communication of two elements or an interaction relationship of two elements. For those of ordinary skill in the art, the specific meanings of the above terms in this application can be understood according to specific situations.

Figure 4:
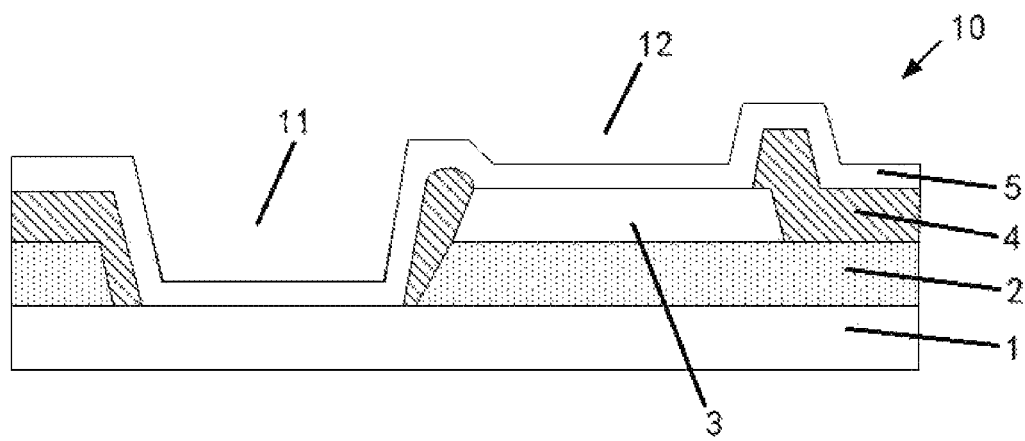
FIG. 4 is a schematic structural diagram of an array substrate according to an embodiment of the present invention.

Referring to FIG. 4, an embodiment of the present invention provides an array substrate 10 including a first metal layer 1, a gate insulating layer 2, a second metal layer 3, a passivation layer 4, and a conductive layer. 5. The conductive layer 5 conducts the first metal layer 1 and the second metal layer 3. Specifically, the gate insulating layer 2 is disposed on the first metal layer 1, the second metal layer 3 is disposed on the gate insulating layer 2, the passivation layer 4 is disposed on the second metal layer 3, and the conductive layer 5 is disposed on the passivation layer 4.

The array substrate 10 further includes a first via 11 and a second via 12. Specifically, the first via 11 penetrates the passivation layer 4 and the gate insulating layer 2, and exposes the first metal layer 1. The second via 12 penetrates the passivation layer 4 and exposes the second metal layer 3. Meanwhile, the conductive layer 5 fills the first via 11 and the second via 12 to electrically connect the first metal layer 1 and the second metal layer 3. The first via 11 is disposed on a side of the second via 12, and the passivation layer 4 partially extends between the first via 11 and the second via 12.

In the present embodiment, a distance between the first via 11 and the second via 12 is less than twice a photoresist layer etching fade distance, and the photoresist layer etching fade distance is an etching fade distance of a photoresist layer 6 provided to protect the passivation layer 4 when the first via 11 and the second via 12 are made.

An example is used to illustrate the photoresist layer etching fade distance. For example, a via of A*B is preset to be formed, where A and B are edge lengths of the via. In an actual etching and digging hole process, the photoresist layer 6 will be slowly etched to form a (A+n)*(B+n) via, where n is the photoresist layer etching fade distance, in other words, n is a reduction of the photoresist layer 6 caused by etching the photoresist layer 6. It can be ensured that the passivation layer 4 under the photoresist layer 6 is remained after the etching and digging hole step by controlling the distance between the first via 11 and the second via 12 within two times the photoresist layer etching fade distance. The passivation layer 4 under the photoresist layer 6 is remained after the etching and digging hole step, so that a side surface of the gate insulating layer 2 under the passivation layer 4 being etched will be prevented from appearing between the first via 11 and the second via 12. Therefore, the poor lapping connection problems such as undercut of the gate insulating layer 2, bird's beak, and breaking of the conductive layer 5 are avoided.

Figure 5:
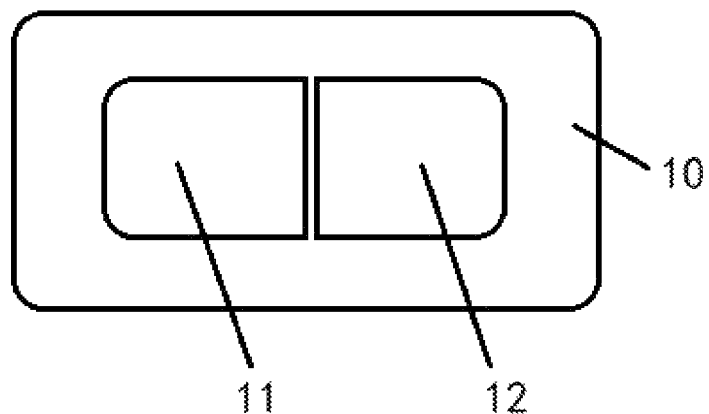
FIG. 5 is a plane view of the array substrate of the embodiment of the present invention.

Please refer to FIG. 5, where FIG. 5 is a top view of the array substrate 10 adopting a single deep-shallow hole design of the present embodiment. The passivation layer 4 is included between the first via 11 and the second via 12. A width of the passivation layer 4 between the first via 11 and the second via 12 is less than twice the photoresist layer etching fade distance.

In the present embodiment, the distance between the first via 11 and the second via 12 is greater than 0.5 times the photoresist layer etching fade distance, preferably one times photoresist layer etching fade distance.

In the present embodiment, material of the first metal layer 1 or the second metal layer 3 is one or a stacked combination of copper, aluminum, and molybdenum.

In the present embodiment, the gate insulating layer 2 or the passivation layer 4 is made of silicon oxide, silicon nitride, or a combination of the silicon oxide and silicon nitride.

In the present embodiment, material of the conductive layer 5 includes indium tin oxide.

The beneficial effect of the present invention is to provide an array substrate 10, by improving the via structure of the single deep-shallow hole to adjust the distance between the first via 11 and the second via 12 to realize that the passivation layer 4 between the first via 11 and the second via 12 is retained in the manufacturing process, which can avoid poor lapping connection problems easily encountered in the deeper first via 11 such as the undercut of the gate insulating layer 2, the bird's beak, and the conductive layer 5 being broken, etc. caused by a side of the gate insulating layer 2 being etched. It can solve the poor lapping connection problem of the conductive layer 5 in the deep-shallow hole (that is, the combination of the first via 11 and the second via 12), and further reduce the contact resistance between the first metal layer 1 and the second metal layer 3 in the single deep-shallow hole, improving product yield, and reducing production costs.

Based on the same inventive concept, one embodiment of the present invention provides a display panel including the array substrate 10 described in any one of the above.

The display panel in the present embodiment can be any product or component having a display function, such as a mobile phone, a tablet computer, a television, a display, a notebook computer, a digital photo frame, a navigator, and the like.

The working principle of the display panel provided in the present embodiment is consistent with the working principle of the foregoing embodiment of the array substrate 10. For specific structural relationship and working principle, refer to the foregoing embodiment of the array substrate 10, and details are not described herein again.

Figure 6:
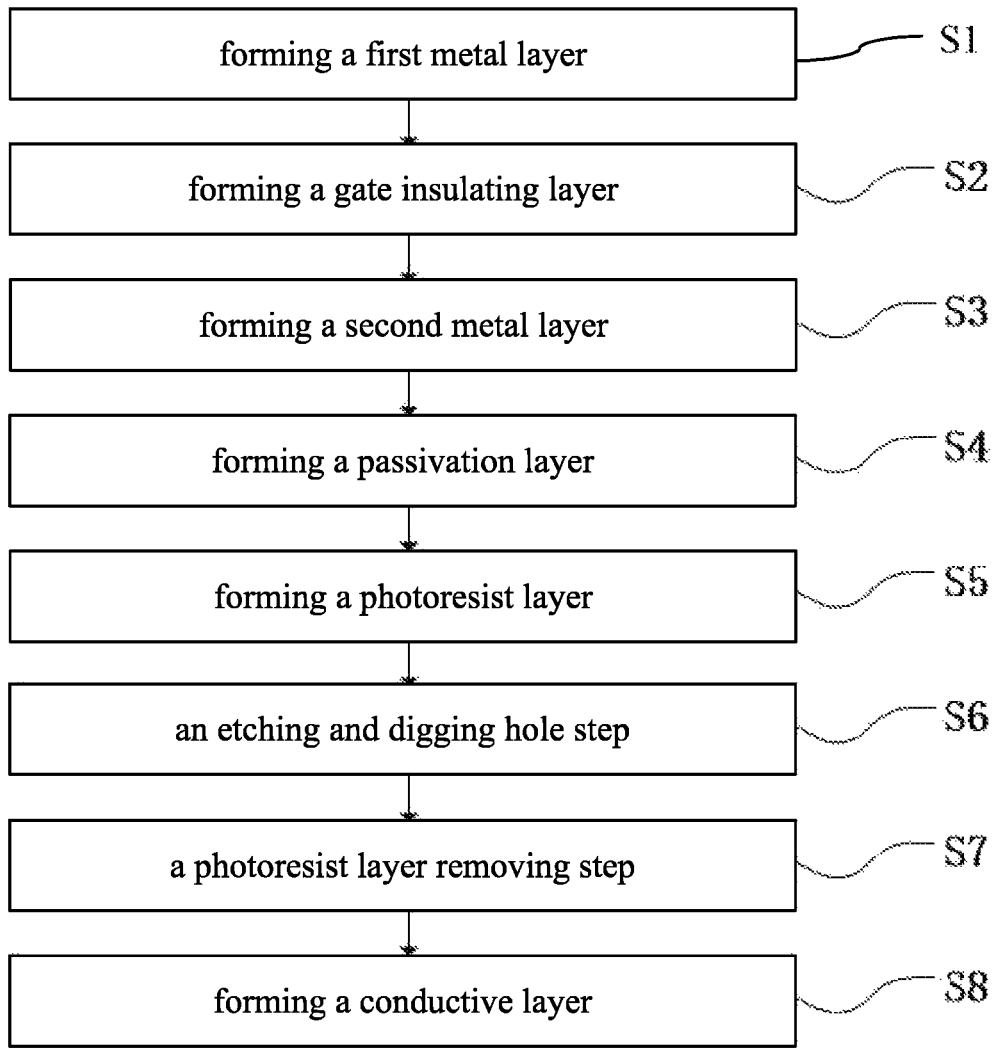
FIG. 6 is a manufacturing flowchart of an array substrate according to an embodiment of the present invention.
Figure 9:
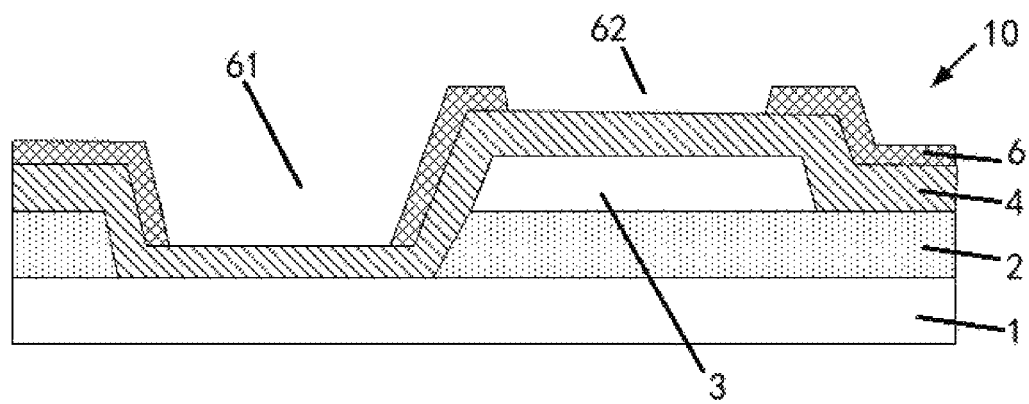
FIG. 9 is a schematic structural diagram of completing the step of manufacturing the photoresist layer in the embodiment of the present invention.

Please refer to FIG. 6 and FIG. 9. In an embodiment of the present invention, a method for manufacturing an array substrate 10 is provided, which includes steps S1 to S8.

Step S1, forming a first metal layer 1, wherein a glass substrate is provided, and the first metal layer 1 is formed on the glass substrate.

Step S2, forming a gate insulating layer 2, wherein the gate insulating layer 2 is formed on the first metal layer 1.

Step S3, forming a second metal layer 3, wherein the second metal layer 3 is formed and patterned on the gate insulating layer 2.

Step S4, forming a passivation layer 4, wherein the passivation layer 4 is formed on the gate insulating layer 2, the passivation layer 4 covers the second metal layer 3, and the passivation layer 4 partially extends on the first metal layer 1.

Step S5, forming a photoresist layer 6, wherein the photoresist layer 6 is formed on the passivation layer 4. As shown in FIG. 9, the photoresist layer 6 includes a first etching hole 61 and a second etching hole 62, and the second etching hole 62 is disposed opposite to the second metal layer 3 and the first etching hole 61 is disposed on a side of the second etching hole 62.

It is worth noting that, in the step of forming the photoresist layer 6, a horizontal distance between the first etching hole 61 and the second etching hole 62 is less than two times the photoresist layer etching fade distance (CD loss). The photoresist layer etching fade distance is an etching fade distance of the photoresist layer 6 provided to protect the passivation layer 4 when the first via 11 and the second via 12 are made. That is to say, the distance between the first via 11 and the second via 12 is controlled to be within two times of the photoresist layer etching fade distance in the etching and digging hole step.

The horizontal distance between the first etching hole 61 and the second etching hole 62 refers to a horizontal distance between the bottom positions of the first etching hole and the second etching hole. The horizontal distance between the bottom positions of the first etching hole 61 and the second etching hole 62 can be directly affected by limiting the horizontal distance between the first etching hole 61 and the second etching hole 62, that is, a width of the passivation layer 4 positioned between the first via 11 and the second via 12 is determined, and then a width of the photoresist layer 6 on the passivation layer 4 positioned between the first via 11 and the second via 12 is determined. In more detail, the distance between the first via 11 and the second via 12 is greater than 0.5 times the photoresist layer etching fade distance, preferably one times the photoresist layer etching fade distance. The width of the passivation layer 4 positioned between the first via 11 and the second via 12 is less than two times the photoresist layer etching fade distance.

An example is used to illustrate the photoresist layer etching fade distance. For example, a via of A*B is preset to be formed, where A and B are edge lengths of the via. In an actual etching and digging hole process, the photoresist layer 6 will be slowly etched to form a (A+n)*(B+n) via, where n is the photoresist layer etching fade distance, in other words, n is a reduction of the photoresist layer 6 caused by etching the photoresist layer 6. It can be ensured that the passivation layer 4 under the photoresist layer 6 is remained after the etching and digging hole step by controlling the distance between the first via 11 and the second via 12 within two times the photoresist layer etching fade distance. The passivation layer 4 under the photoresist layer 6 is remained after the etching and digging hole step, so that a side surface of the gate insulating layer 2 under the passivation layer 4 being etched will be prevented from appearing between the first via 11 and the second via 12. Therefore, the poor lapping connection problems such as undercut of the gate insulating layer 2, bird's beak, and breaking of the conductive layer 5 are avoided.

Step S6, an etching and digging hole step, etching on a side of the photoresist layer 6, and forming a first via 11 corresponding to the first etching hole and a second via 12 corresponding to the second etching hole after etching; wherein the first via 11 penetrates the passivation layer 4 and the gate insulation layer 2 and exposes the first metal layer 1, and the second via 12 penetrates the passivation layer 4 and exposes the second metal layer 13.

It is worth noting that, in the etching and digging hole step, because of a range of the photoresist layer etching fade distance, the passivation layer 4 between the first via 11 and the second via 12 is retained after the etching. which can avoid poor lapping connection problems easily encountered in the deeper first via 11 such as the undercut of the gate insulating layer 2, the bird's beak, and the conductive layer 5 being broken, etc. caused by a side of the gate insulating layer 2 being etched.

Step S7, a photoresist layer removing step, removing the remaining photoresist layer 6, wherein a method of removing the remaining photoresist layer 6 is to dry and bake the photoresist layer 6 to make the photoresist layer 6 fall off Step S8, forming a conductive layer 5, wherein the conductive layer 5 is formed on a side of the passivation layer 4, the conductive layer 5 is disposed in the first via 11 and the second via 12 and conducts the first metal layer 1 and the second metal layer 3.

Figure 7:
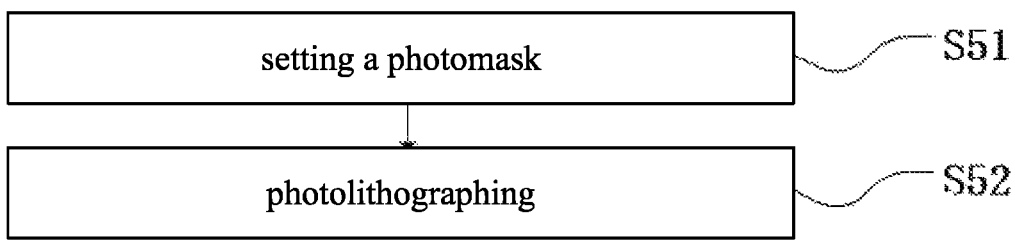
FIG. 7 is a manufacturing flowchart of a step of manufacturing a photoresist layer described in FIG. 6.
Figure 8:
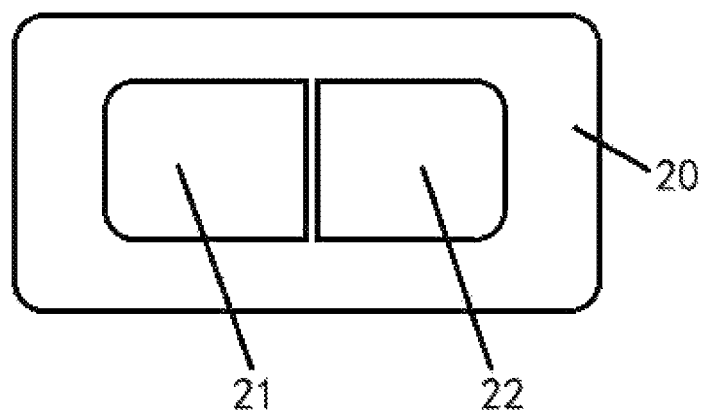
FIG. 8 is a schematic structural diagram of a photomask according to the embodiment of the present invention.

Please refer to FIG. 7 to FIG. 9, in the present embodiment, the step S5 of forming the photoresist layer 6 specifically includes steps S51 to S52.

Step S51, setting a photomask 20, disposing the photomask 20 above the photoresist layer 6, as shown in FIG. 8, the photomask 20 includes a first through hole 21 disposed opposite to the first etching hole 61 and a second through hole 22 disposed opposite to the second etching hole 62. A distance between the first through hole 21 and the second through hole 22 is greater than 0.5 times the photoresist layer etching fade distance, and preferably one times the photoresist layer etching fade distance.

Step S52, photolithographing, as shown in FIG. 9, wherein the photoresist layer 6 forms a first etching hole 61 corresponding to the first through hole and a second etching hole 62 corresponding to the second through hole after photolithographing.

In the present embodiment, material of the first metal layer 1 or the second metal layer 3 is one or a stacked combination of copper, aluminum, and molybdenum.

In the present embodiment, the gate insulating layer 2 or the passivation layer 4 is made of silicon oxide, silicon nitride, or a combination of the silicon oxide and silicon nitride.

In the present embodiment, material of the conductive layer 5 includes indium tin oxide.

The beneficial effect of the present invention is to provide method for manufacturing the array substrate 10, by improving the via structure of the single deep-shallow hole to adjust the distance between the first via 11 and the second via 12 to realize that the passivation layer 4 between the first via 11 and the second via 12 is retained in the manufacturing process, which can avoid poor lapping connection problems easily encountered in the deeper first via 11 such as the undercut of the gate insulating layer 2, the bird's beak, and the conductive layer 5 being broken, etc. caused by a side of the gate insulating layer 2 being etched. It can solve the poor lapping connection problem of the conductive layer 5 in the deep-shallow hole (that is, the combination of the first via 11 and the second via 12), and further reduce the contact resistance between the first metal layer 1 and the second metal layer 3 in the single deep-shallow hole, improving product yield, and reducing production costs.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:
1. An array substrate, comprising:
a first metal layer;
a gate insulating layer disposed on the first metal layer;
a second metal layer disposed on the gate insulating layer;
a passivation layer disposed on the second metal layer; and
a conductive layer disposed on the passivation layer;
wherein the array substrate further comprises:
a first via penetrating the passivation layer and the gate insulating layer and exposing the first metal layer; and
a second via penetrating the passivation layer and exposing the second metal layer;
wherein the conductive layer is disposed in the first via and the second via to electrically connect the first metal layer and the second metal layer; and
the first via is disposed on a side of the second via, the passivation layer partially extends between the first via and the second via, the passivation layer covers the second metal layer on a side of the first via, a distance between the first via and the second via is less than two times a photoresist layer etching fade distance, and the photoresist layer etching fade distance is an etching fade distance of a photoresist layer provided to protect the passivation layer when the first via and the second via are made.

2. The array substrate according to claim 1, wherein material of the first metal layer or the second metal layer comprises one or a stacked combination of copper, aluminum, and molybdenum.

3. The array substrate according to claim 1, wherein the gate insulating layer or the passivation layer is made of silicon oxide, silicon nitride, or a combination of silicon oxide and silicon nitride.

4. The array substrate according to claim 1, wherein material of the conductive layer comprises indium tin oxide.

5. A display panel, comprising the array substrate according to claim 1.

6. A method for manufacturing an array substrate, comprising the steps:
- forming a first metal layer, wherein a glass substrate is provided, and a first metal layer is formed on the glass substrate;
- forming a gate insulating layer, wherein the gate insulating layer is formed on the first metal layer;
- forming a second metal layer, wherein the second metal layer is formed and patterned on the gate insulating layer;
- forming a passivation layer, wherein the passivation layer is formed on the gate insulating layer, the passivation layer covers the second metal layer, and the passivation layer partially extends on the first metal layer;
- forming a photoresist layer, wherein the photoresist layer is formed on the passivation layer, the photoresist layer comprises a first etching hole and a second etching hole, and the second etching hole is disposed opposite to the second metal layer and the first etching hole is disposed on a side of the second etching hole;
- an etching and digging hole step, etching on a side of the photoresist layer, and forming a first via corresponding to the first etching hole and a second via corresponding to the second etching hole after etching; wherein the first via penetrates the passivation layer and the gate insulation layer and exposes the first metal layer, the second via penetrates the passivation layer and exposes the second metal layer, and the passivation layer partially extends between the first via and the second via;
- a photoresist layer removing step, removing the remaining photoresist layer; and
- forming a conductive layer, wherein the conductive layer is formed on a side of the passivation layer, the conductive layer is disposed in the first via and the second via and conducts the first metal layer and the second metal layer.

7. The method for manufacturing the array substrate according to claim 6, wherein a method of removing the remaining photoresist layer is to dry and bake the photoresist layer to make the photoresist layer fall off.

8. The method for manufacturing the array substrate according to claim 6, wherein the step of forming the photoresist layer comprises:
- setting a photomask, disposing the photomask above the photoresist layer, wherein the photomask comprises a first through hole and a second through hole; and
- photolithographing, wherein the photoresist layer forms a first etching hole corresponding to the first through hole and a second etching hole corresponding to the second through hole after photolithographing.

9. The method for manufacturing the array substrate according to claim 8, wherein the photomask comprises a half tone mask.

* * * * *